US009362877B2

(12) United States Patent
Maeda et al.

(10) Patent No.: US 9,362,877 B2
(45) Date of Patent: Jun. 7, 2016

(54) ELECTRONIC COMPONENT, INFORMATION PROCESSING APPARATUS, AND ELECTRONIC COMPONENT CONTROL METHOD

(71) Applicant: FUJITSU LIMITED, Kawasaki-shi, Kanagawa (JP)

(72) Inventors: Masazumi Maeda, Yokohama (JP); Yoshiharu Yoshizawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/275,111

(22) Filed: May 12, 2014

(65) Prior Publication Data

US 2015/0002205 A1   Jan. 1, 2015

(30) Foreign Application Priority Data

Jun. 28, 2013   (JP) .................................. 2013-136907

(51) Int. Cl.
*H03G 3/00*   (2006.01)
*H03K 19/094*   (2006.01)
*H03G 1/00*   (2006.01)

(52) U.S. Cl.
CPC ............. *H03G 3/004* (2013.01); *H03G 1/0029* (2013.01); *H03K 19/09432* (2013.01)

(58) Field of Classification Search
CPC ....... H03G 3/00; H03G 3/004; H03G 1/0029; H03K 19/00; H03K 19/09432
USPC .......................................... 327/108, 112, 387
See application file for complete search history.

(56) References Cited

U.S. PATENT DOCUMENTS

| 6,791,356 | B2* | 9/2004 | Haycock et al. ................. 326/82 |
| 8,451,062 | B2* | 5/2013 | Seefeldt et al. ................ 330/295 |
| 2003/0222705 | A1 | 12/2003 | Tamura et al. |
| 2006/0091915 | A1* | 5/2006 | Pauletti et al. ................. 327/108 |
| 2008/0088365 | A1* | 4/2008 | Jang .............................. 327/563 |
| 2013/0162353 | A1* | 6/2013 | Hwang .......................... 330/260 |

FOREIGN PATENT DOCUMENTS

JP   2003-347920   12/2003

* cited by examiner

*Primary Examiner* — John Poos
*Assistant Examiner* — David Mattison
(74) *Attorney, Agent, or Firm* — Staas & Halsey LLP

(57) ABSTRACT

An electronic component includes: a first amplifier configured to amplify one of differential signals; a second amplifier configured to amplify another one of the differential signals; a sensor configured to measure voltages of a first output signal outputted from the first amplifier and a second output signal outputted from the second amplifier; and a controller configured to control, based on the voltages measured by the sensor, either one or both of a current and a resistance value of the first amplifier so that a common voltage of the first output signal and a common voltage of the second output signal are approximate to each other.

9 Claims, 10 Drawing Sheets

ELECTRONIC COMPONENT, INFORMATION PROCESSING APPARATUS, AND ELECTRONIC COMPONENT CONTROL METHOD

CROSS-REFERENCE TO RELATED APPLICATION

This application is based upon and claims the benefit of priority of the prior Japanese Patent Application No. 2013-136907, filed on Jun. 28, 2013, the entire contents of which are incorporated herein by reference.

FIELD

The embodiments discussed herein are related to an electronic component, information processing apparatus, and electronic component control method.

BACKGROUND

In recent years, the performance of components configuring computers and information processing devices has been significantly improved. For example, the performance of static random access memories (SRAMs), dynamic random access memories (DRAMs), processors, switch LSIs, and so on has been improved. Accordingly, to improve the performance of the entire system, it is preferable to improve a signal transmission speed among these components or elements.

For example, a gap in speed between a memory such as an SRAM or DRAM and a processor tends to increase, and this speed gap is gradually hindering improvement in computer performance in recent years. Moreover, with an increase in chip size, not only the speed in signal transmission between these chips but also the speed in signal transmission between elements in a chip and between circuit blocks serves as a major factor in restricting chip performance. Furthermore, signal transmission between a peripheral device and a processor/chip set also serves as a factor in restricting the performance of the entire system.

To increase the speed in signal transmission between circuit blocks, between chips, or within a housing, it is important to propagate a high-speed clock to a circuit block without degrading the quality of the clock (such as skew or jitter amount), because clock timing accuracy provides reception timing accuracy and timing accuracy of a generated signal.

With this improvement in transmission rate, a current mode logic (CML) buffer is increasingly adopted to a clock transmission circuit, as typified by a high-speed serializer/deserializer (SerDes) in recent years. A reason for this is, for example, that the CML buffer has a jitter performance lower than that of a complementary metal oxide semiconductor (CMOS) buffer. The CML buffer is a type of clock transmission circuit for differential clock transmission. The CML buffer operates in a manner such that when one of input signals, which are paired differential signals, rises to a high level, the other is down to a low level, thereby making the balance of operation of the differential signals favorable.

In related art, current feedback is performed in the above-described CML buffer so that common voltages of an input signal and an output signal are equal to each other, thereby reducing jitters.

Here, in the CML buffer, the output amplitude may be decreased due to a shortage of bands of the single CML buffer, causing the CML buffer to become easily influenced by variability at the time of manufacturing and causing an occurrence of a difference between common voltages of an output of one of the paired differential signals and an output of the other in a transmission clock. In this case, a differential duty ratio may be out of balance. When the differential duty ratio is out of balance, it is difficult to generate an appropriate clock.

Furthermore, when CML buffers are connected in a multistage manner, one output and the other output are separated apart from each other every passage through each stage, possibly increasing the difference in common voltage therebetween.

To address this problem, in related art, a capacitive cell is disposed between CML buffers to cut a direct current (DC) component, thereby adjusting the difference in common voltage between differential signals.

However, to cut a DC component at a low frequency, a large capacitive cell is used. Therefore, to allow a clock transmission circuit to support a clock with a wide frequency band, a large-sized capacitive cell is used, thereby enlarging the mounting area of the clock transmission circuit.

The following is reference document:
[Document 1] Japanese Laid-open Patent Publication No. 2003-347920.

SUMMARY

According to an aspect of the invention, an electronic component includes: a first amplifier configured to amplify one of differential signals; a second amplifier configured to amplify another one of the differential signals; a sensor configured to measure voltages of a first output signal outputted from the first amplifier and a second output signal outputted from the second amplifier; and a controller configured to control, based on the voltages measured by the sensor, either one or both of a current and a resistance value of the first amplifier so that a common voltage of the first output signal and a common voltage of the second output signal are approximate to each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the electronic component, information processing apparatus, and electronic component control method disclosed herein are described in detail below based on the drawings. Note that the electronic component, information processing apparatus, and electronic component control method disclosed herein are not restricted by the following embodiments.

First Embodiment

Figure 1:
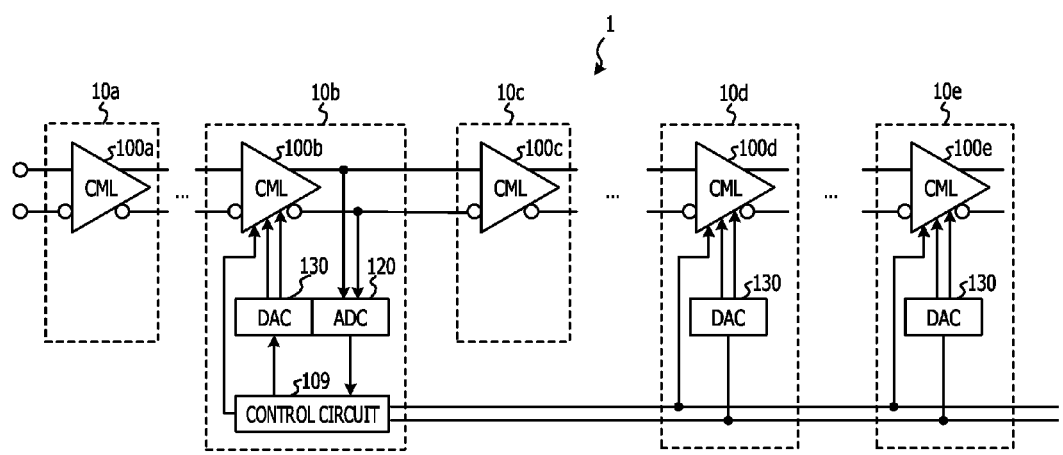
FIG. 1 is a circuit diagram depicting a general outline of a clock transmission circuit according to a first embodiment.

FIG. 1 is a circuit diagram depicting a general outline of a clock transmission circuit according to a first embodiment. For example, when a clock transmission distance is long, a clock transmission circuit 1 has multistage CML buffers, as depicted in FIG. 1.

In FIG. 1, among many CML buffers, CML buffers 100a to 100e are exemplarily depicted. In the following, the CML buffers 100a to 100e are simply referred to as a "CML buffer 100" when they are not distinguished from one another. The CML buffers 100a and 100c are CML buffers without having a common voltage control function. The CML buffer 100b is formed as having a common voltage control function, together with an analog digital converter (ADC) 120, a digital analog converter (DAC) 130, and a control circuit 109. The CML buffers 100d and 100e are formed as having a common voltage control function, together with the DAC 130.

In the CML buffer 100, a common voltage of each differential signal is shifted unless common voltage control is performed, leading to the occurrence of a difference in common voltage between differential signals.

Furthermore, when the CML buffers 100 are provided in a multistage manner, every passage through each CML buffer 100, a difference in common voltage is increased by simple addition. Thus, the CML buffers with a common voltage control function are preferably disposed so as to be uniformly spaced apart from each other. For example, the number of stages from the CML buffer 10a to the CML buffer 10b, the number of stages from the CML buffer 10b to the CML buffer 10d, and the number of stages from the CML buffer 10d to the CML buffer 10e are equal to one another.

Next, the detailed structure of the CML buffers 100a and 100c and the CML buffers 10b, 10d, and 10e is described.

Figure 2:
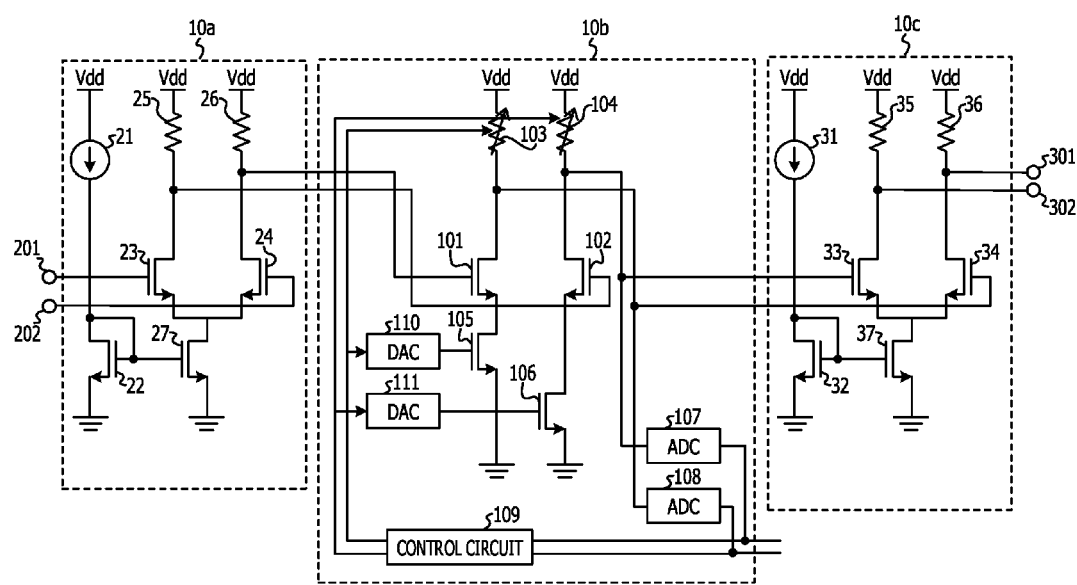
FIG. 2 is a circuit diagram depicting details of the clock transmission circuit according to the first embodiment.

FIG. 2 is a circuit diagram depicting details of the clock transmission circuit according to the first embodiment. The CML buffer 10b is a clock buffer with a common voltage control function. This CML buffer 10b is an example of an "electronic component".

The CML buffer 10b has transistors 101 and 102, variable resistors 103 and 104, transistors 105 and 106, ADCs 107 and 108, a control circuit 109, and DACs 110 and 111. The CML buffer 100b in FIG. 1 corresponds to, for example, the transistors 101 and 102, the variable resistors 103 and 104, and the transistors 105 and 106. Furthermore, a set of the ADCs 107 and 108 corresponds to the ADC 120 in FIG. 1. Still further, a set of the DACs 110 and 111 corresponds to the DAC 130 in FIG. 1.

Still further, a constant current source 21, transistors 22 to 24, resistors 25 and 26, and a transistor 27 form a CML buffer 10a disposed at the preceding stage of the CML buffer 10b.

Still further, a constant current source 31, transistors 32 to 34, resistors 35 and 36, and a transistor 37 form a CML buffer 10c disposed at the subsequent stage of the CML buffer 10b. Each of the CML buffers 100a and 100c is a CML buffer formed of, for example, the constant current source 21, the transistors 22 to 24, the resistors 25 and 26, and the transistor 27.

The constant current source 21 is connected to the drain terminal of the transistor 22. The constant current source 21 lets a predetermined current flow therethrough.

The transistor 22 is a MOS transistor. The source terminal of the transistor 22 is connected to the ground. Here, while the transistor 22 is connected to the ground in the present embodiment, this is not meant to be restrictive, and the transistor 22 may be connected to a negative power supply voltage. The constant current source 21 and the transistor 22 form a bias circuit. A bias voltage (Vbias) with a predetermined value is applied to the gate terminals of the transistors 22 and 27.

The transistors 23 and 24 are MOS transistors. An input terminal 201 of a positive input signal of differential signals is connected to the gate terminal of the transistor 23. That is, the voltage of the positive input signal sent from the input terminal 201 is applied to the gate terminal of the transistor 23.

The resistor 25 is disposed between the drain terminal of the transistor 23 and a power supply voltage.

An input terminal 202 of a negative input signal of the differential signals is connected to the gate terminal of the transistor 24. That is, the voltage of the negative input signal sent from the input terminal 202 is applied to the gate terminal of the transistor 24.

Here, the negative input signal is a signal obtained by shifting the phase of the positive input signal by 180 degrees, that is, an inversion signal of the positive input signal.

The resistor 26 is disposed between the drain terminal of the transistor 24 and the power supply voltage.

The transistor 27 is a MOS transistor. The transistor 27 is cascode-connected to the transistors 23 and 24. Specifically, the source terminals of the transistors 23 and 24 are commonly connected to the drain terminal of the transistor 27. Furthermore, the source terminal of the transistor 27 is connected to the ground. Here, while the transistor 27 is connected to the ground in the present embodiment, this is not meant to be restrictive, and the transistor 27 may be connected to a negative power supply voltage. A bias voltage with a predetermined value is applied to the gate terminal of the transistor 27. The transistor 27 is a bias transistor for the transistors 23 and 24. That is, the transistor 27 is a tail transistor which extracts a predetermined current from the transistors 23 and 24.

The transistor 27 extracts the predetermined current from the transistors 23 and 24. When the positive input signal is at a high level "H" (higher than a threshold voltage) and the negative input signal is at a low level "L" (lower than the threshold voltage), the transistor 23 is in an ON state. Therefore, the predetermined current flows from the power supply voltage Vdd via the resistor 25, the transistor 23, and then the transistor 27 to the ground. By contrast, since the transistor 24 is in an OFF state, a current does not flow.

When the circuit is in the above-described state, it is assumed that the positive input signal falls down to a low level and the negative input signal rises to a high level. Then, the route of the current flowing from the power supply voltage Vdd is switched, causing the current to flow on a transistor 24 side.

The transistor 101 is a MOS transistor. The gate terminal of the transistor 101 is connected between the resistor 26 and the transistor 24. That is, with the transistor 24 being in an OFF state, a potential approximately equal to the power supply voltage Vdd is applied to the gate terminal of the transistor 101. The signal inputted to the gate terminal of the transistor 101 is a positive input signal. This transistor 101 corresponds to an example of a "first transistor".

The variable resistor 103 is a resistor with its resistance value variable. When the current value of a current flowing when the transistor 101 is turned ON is fixed, if the resistance of the variable resistor 103 is increased, the voltage drop of the variable resistor 103 is also increased proportionately. With this, the lower limit of the output voltage range of the drain terminal (output terminal) of the transistor 101 is moved downward to increase the amplitude of the signal. That is, the common voltage of the output signal falls down. On the contrary, when the resistance of the variable resistor 103 is decreased, the voltage drop is decreased proportionately. With this, the lower limit of the output voltage range of the drain terminal (output terminal) of the transistor 101 is moved upward to decrease the amplitude of the signal. That is, the common voltage of the output signal rises. Here, while the variable resistor 103 is a variable resistor in the present embodiment, the variable resistor 103 is not restrictive as long as its resistance value is variable. For example, the variable resistor 103 may be configured to include a plurality of resistors with different resistance values, and any resistor is selected by a switch. In the variable resistor 103, the resistance value is changed by control from the control circuit 109.

The variable resistor 103 is disposed between the drain terminal of the transistor 101 and the power supply voltage. The route between the variable resistor 103 and the transistor 101 is branched and connected to the gate terminal of the transistor 34 and the ADC 108, which will be described further below.

The transistor 105 is a MOS transistor. The transistor 105 is cascode-connected to the transistor 101. Specifically, the source terminal of the transistor 101 is connected to the drain terminal of the transistor 105. The source terminal of the transistor 105 is connected to the ground. Here, while the transistor 105 is connected to the ground in the present embodiment, this is not meant to be restrictive, and the transistor 105 may be connected to a negative power supply voltage.

The transistor 105 is a bias transistor for the transistor 101. That is, the transistor 105 is a tail transistor which extracts a predetermined current from the transistor 101. The gate terminal of the transistor 105 is connected to the DAC 110. The transistor 105 receives application of a bias voltage from the DAC 110.

Here, the current value of the current extracted by the transistor 105 from the transistor 101 increases when the bias voltage increases. With this, the voltage drop of the variable resistor 103 is increased, the lower limit of the output voltage range of the drain terminal (output terminal) of the transistor 101 is moved downward, and the amplitude of the signal is increased. That is, the common voltage of the output signal is decreased. On the contrary, when the bias voltage decreases, the current value decreases. With this, the voltage drop of the variable resistor 103 is decreased, the lower limit of the output voltage range of the drain terminal (output terminal) of the transistor 101 is moved upward, and the amplitude of the signal is decreased. That is, the common voltage of the output signal is increased.

The transistor 105 is a tail transistor which extracts a predetermined current from the transistor 101. When the positive input signal is at a high level "H", the transistor 101 is turned ON, and the predetermined current flows from the power supply voltage Vdd via the variable resistor 103, the transistor 101, and then the transistor 105 to the ground.

When the circuit is in the above-described state, when the positive input signal falls down to a low level, the transistor 101 is turned OFF, the voltage drop of the variable resistor 103 becomes approximately zero, and the voltage applied to the gate of the transistor 34 and the ADC 108, which will be described further below, becomes approximately the power supply voltage Vdd. This voltage transition corresponds to an example of a "first output signal".

The transistor 102 is a MOS transistor. The gate terminal of the transistor 102 is connected between the resistor 25 and the transistor 23. That is, with the transistor 23 being in an OFF state, a potential approximately equal to the power supply voltage Vdd is applied to the gate terminal of the transistor 102. The signal inputted to the gate terminal of the transistor 102 is a negative input signal. This transistor 102 corresponds to an example of a "second transistor".

The variable resistor 104 is a resistor with its resistance value variable. When the current value of a current flowing when the transistor 102 is turned ON is fixed, if the resistance of the variable resistor 104 is increased, the voltage drop of the variable resistor 104 is also increased proportionately. With this, the lower limit of the output voltage range of the drain terminal (output terminal) of the transistor 102 is moved downward to increase the amplitude of the signal. That is, the common voltage of the output signal falls down. On the contrary, when the resistance of the variable resistor 104 is decreased, the voltage drop is decreased proportionately. With this, the lower limit of the output voltage range of the drain terminal (output terminal) of the transistor 102 is moved upward to decrease the amplitude of the signal. That is, the common voltage of the output signal rises. Here, while the variable resistor 104 is a variable resistor in the present embodiment, as with the variable resistor 103, the variable resistor 104 is not restrictive as long as its resistance value is variable. In the variable resistor 104, the resistance value is changed by control from the control circuit 109.

The variable resistor 104 is disposed between the drain terminal of the transistor 102 and the power supply voltage. The route between the variable resistor 104 and the transistor 102 is branched and connected to the gate terminal of the transistor 34 and the ADC 107, which will be described further below.

The transistor 106 is a MOS transistor. The transistor 106 is cascode-connected to the transistor 102. Specifically, the source terminal of the transistor 102 is connected to the drain terminal of the transistor 106. The source terminal of the transistor 106 is connected to the ground. Here, while the transistor 106 is connected to the ground in the present embodiment, this is not meant to be restrictive, and the transistor 106 may be connected to a negative power supply voltage.

The transistor 106 is a tail transistor which extracts a predetermined current from the transistor 102. The gate terminal of the transistor 106 is connected to the DAC 111. The transistor 106 receives application of a bias voltage from the DAC 111.

Here, the current value of the current extracted by the transistor 106 from the transistor 102 increases when the bias voltage increases. With this, the voltage drop of the variable resistor 104 is increased, the lower limit of the output voltage range of the drain terminal (output terminal) of the transistor 102 is moved downward, and the amplitude of the signal is increased. That is, the common voltage of the output signal is decreased. On the contrary, when the bias voltage decreases, the current value decreases. With this, the voltage drop of the variable resistor 104 is decreased, the lower limit of the output voltage range of the drain terminal (output terminal) of the transistor 102 is moved upward, and the amplitude of the signal is decreased. That is, the common voltage of the output signal is increased.

The transistor 106 is a tail transistor which extracts a predetermined current from the transistor 102. When the negative input signal is at a high level "H", the transistor 102 is turned ON, and the predetermined current flows from the power supply voltage Vdd via the variable resistor 104, the transistor 102, and then the transistor 106 to the ground.

When the circuit is in the above-described state, when the negative input signal falls down to a low level, the transistor 102 is turned OFF, the voltage drop of the variable resistor 104 becomes approximately zero, and the voltage applied to the gate of the transistor 33 and the ADC 107, which will be described further below, becomes approximately the power supply voltage Vdd. This voltage transition corresponds to an example of a "second output signal".

Here, the variable resistor 103, the transistor 101, and the transistor 105 correspond to an example of a "first amplifying unit". Also, the variable resistor 104, the transistor 102, and the transistor 106 correspond to an example of a "second amplifying unit".

The ADC 107 measures the voltage of the drain terminal of the transistor 102. Here, the signal inputted to the ADC 107 is a positive signal to be outputted by the CML buffer 10b to the CML buffer 10c at the subsequent stage. The ADC 107 then outputs the measurement result to the control circuit 109.

The ADC 108 measures the voltage of the drain terminal of the transistor 101. Here, the signal inputted to the ADC 108 is a negative signal to be outputted by the CML buffer 10b to the CML buffer 10c at the subsequent stage. The ADC 108 then outputs the measurement result to the control circuit 109. These ADCs 107 and 108 are an example of a "sensor".

The control circuit 109 stores a set value of the common voltage of each of the positive output signal and the negative output signal of the CML buffer 10b. Also, the control circuit 109 stores initial values of the variable resistors 103 and 104 and an initial value of the bias voltage to be applied to the transistors 105 and 106. Furthermore, the control circuit 109 stores an allowable range of a difference between the set value and the measurement value of the common voltage. Still further, the control circuit 109 stores a threshold for determining the magnitude of the difference between the set value and the measurement value of the common voltage. Still further, the control circuit 109 stores a fluctuation amount of resistance in one control (this may be hereinafter referred to as "one step") over the variable resistors 103 and 104. Still further, the control circuit 109 stores a fluctuation amount of the bias voltage for one step with respect to the transistors 105 and 106. These set values may be externally set.

When an information processing apparatus having incorporated therein the clock transmission circuit 1 depicted in FIG. 2 is powered on, the control circuit 109 controls the variable resistors 103 and 104 so that each resistance value has the initial value. Furthermore, the control circuit 109 controls the DACs 110 and 111 so that the bias voltage value has the initial value.

The control circuit 109 receives a sampling value of the drain terminal voltage of the transistor 102 from the ADC 107. The control circuit 109 also receives a sampling value of the drain terminal voltage of the transistor 101 from the ADC 108. The control circuit 109 then adjusts the amplitudes of the positive signal and the negative signal to make the respective common voltages approximate to each other. In the following, common voltage control is described. Since adjustment of the positive signal and adjustment of the negative signal are the same operation, only adjustment of the positive signal is described herein.

Next, the control circuit 109 calculates a common voltage of the positive signal based on the measurement result of the voltage of the positive signal received from the ADC 107. Furthermore, the control circuit 109 finds a difference between the measurement value and the set value of the common voltage of the positive signal (hereinafter simply referred to as a "difference"). The control circuit 109 then determines whether the difference is within the allowable range. When the difference is within the allowable range, the control circuit 109 ends common voltage control.

On the other hand, when the difference exceeds the allowable range, the control circuit 109 determines whether the difference is large or small. Specifically, the control circuit 109 determines that the difference is large when the difference is equal to or larger than the threshold, and determines that the difference is small when the difference is smaller than the threshold.

The control circuit 109 performs rough adjustment of changing the resistances of the variable resistors 103 and 104 when the difference is large, and performs fine adjustment of changing the bias voltage to the transistors 105 and 106.

Here, the bias voltage has an adequate voltage range in which the transistors 101 and 102, which form an input differential pair, are capable of being operated correctly. The adequate voltage range is uniquely determined by the process or the size of the transistors. Thus, the control circuit 109 controls the bias voltage so that the bias voltage does not exceed the adequate voltage range. For this reason, bias voltage control is not enough when the difference is large and it is desired to significantly change the amplitude and significantly change the common voltage. In this case, the control circuit 109 controls the resistance values of the variable resistors 103 and 104 to change the amplitude. That is, the control circuit 109 is capable of significantly changing the common voltage. On the other hand, compared with the resistance adjustment, bias voltage adjustment allows finer adjustment of the amplitude. That is, the control circuit 109 is capable of fine adjustment of the common voltage. Thus, when the difference is small and the amplitude is slightly changed, the control circuit 109 changes the amplitude by controlling the bias voltage. Details of amplitude adjustment by the control circuit 109 are described below.

When the difference is large, the control circuit 109 determines which of the measurement value and the set value is larger. When the measurement value is larger than the set value, the control circuit 109 increases the resistance value of the variable resistor 103 by one step. On the other hand, when the measurement value is smaller than the set value, the control circuit 109 decreases the resistance value of the variable resistor 103 by one step. The control circuit 109 repeats the step of controlling the resistance value of the variable resistor 103 until the difference becomes small or falls within the allowable range.

When the difference is small, the control circuit 109 determines which of the measurement value and the set value is larger. When the measurement value is larger than the set value, the control circuit 109 instructs the DAC 110 to increase the bias voltage to be applied to the transistor 105 by one step. On the other hand, when the measurement value is smaller than the set value, the control circuit 109 instructs the DAC 110 to decrease the bias voltage to be applied to the transistor 105 by one step. The control circuit 109 repeats the step of controlling the resistance value of the variable resistor 103 until the difference falls within the allowable range.

While control over the positive signal has been described above, the control circuit 109 performs similar processing for the negative signal. This control circuit 109 corresponds to an example of a "control unit".

The DAC 110 is connected to the gate terminal of the transistor 105. The DAC 110 receives an instruction from the control circuit 109 for applying a bias voltage to the transistor 105. The DAC 110 applies a bias voltage with a specified voltage value to the gate terminal of the transistor 105.

The DAC 111 is connected to the gate terminal of the transistor 106. The DAC 111 receives an instruction from the control circuit 109 for applying a bias voltage to the transistor 106. The DAC 111 applies a bias voltage with a specified voltage value to the gate terminal of the transistor 106.

Figure 3A:
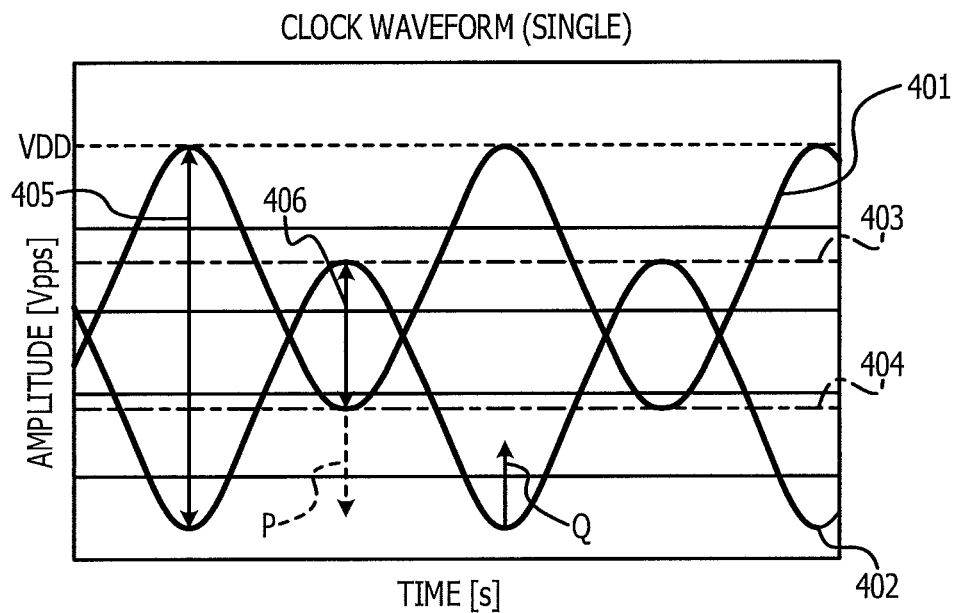
FIG. 3A is a diagram depicting a positive signal and a negative signal before common voltage adjustment.
Figure 3B:
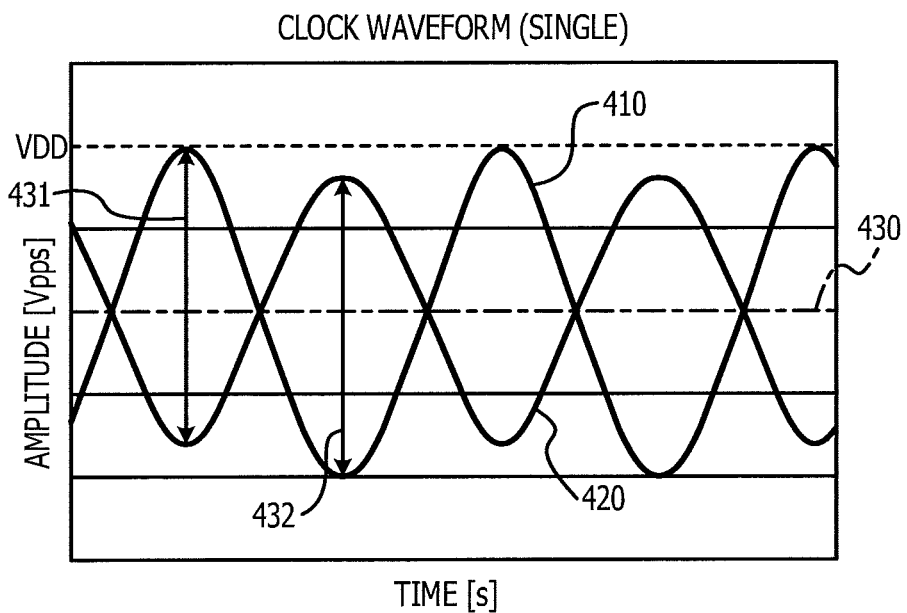
FIG. 3B is a diagram depicting the positive signal and the negative signal after common voltage adjustment.
Figure 4A:
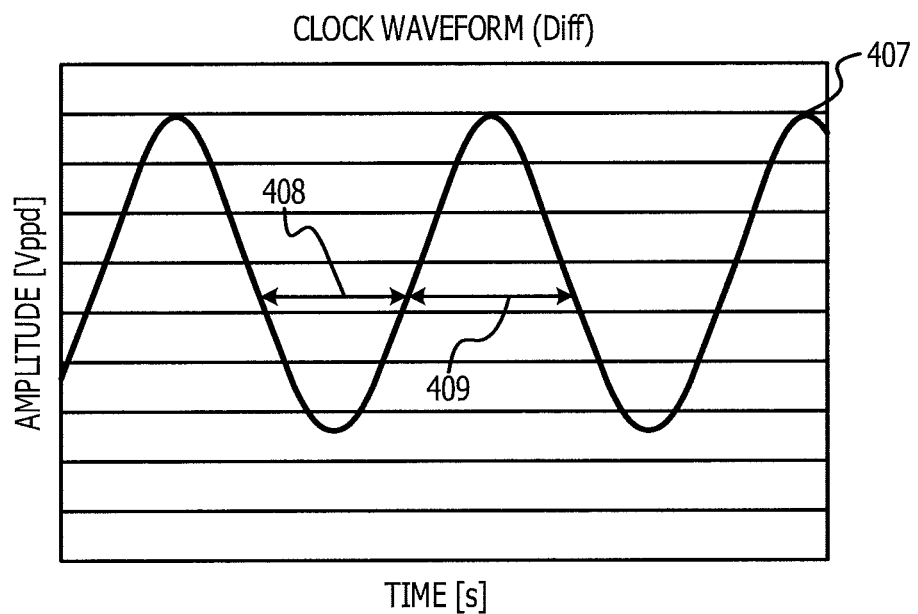
FIG. 4A is a diagram depicting a clock waveform generated by using a differential signal in the state of FIG. 3A.
Figure 4B:
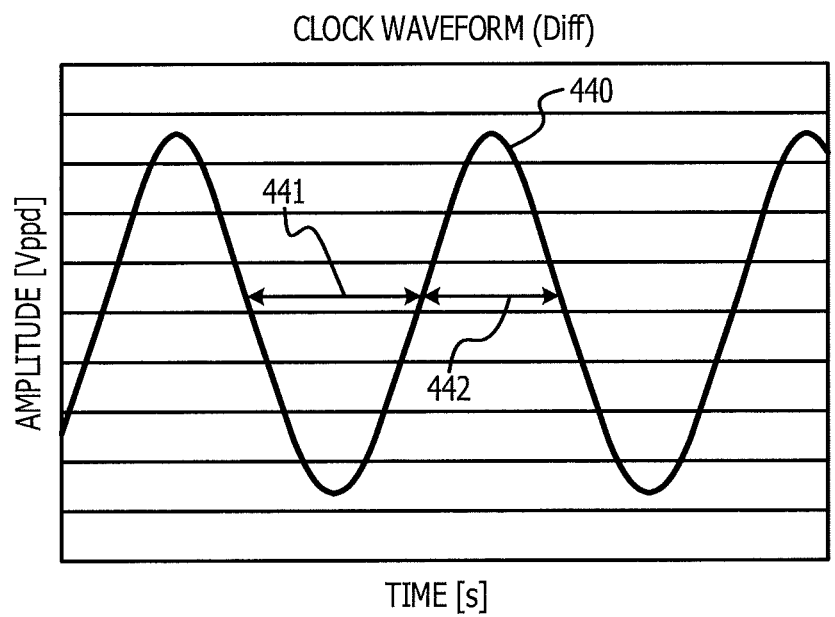
FIG. 4B is a diagram depicting a clock waveform generated by using a differential signal in the state of FIG. 3B.

Here, with reference to FIGS. 3A, 3B, 4A, and 4B, changes of the positive signal and the negative signal by common voltage adjustment are described. FIG. 3A is a diagram depicting the positive signal and the negative signal before common voltage adjustment. FIG. 3B is a diagram depicting the positive signal and the negative signal after common voltage adjustment. FIG. 4A is a diagram depicting a clock waveform generated by using a differential signal in the state of FIG. 3A. FIG. 4B is a diagram depicting a clock waveform generated by using a differential signal in the state of FIG. 3B. In any of FIGS. 3A, 3B, 4A, and 4B, the vertical axis represents potential difference and the horizontal axis represents time.

In the state where common voltage adjustment is not performed, the positive signal sticks toward a power supply voltage side and the negative signal goes away from the power supply voltage. In this manner, the positive signal and the negative signal are in a separated state, which is depicted in FIG. 3A. In FIG. 3A, a graph 401 represents the positive signal and a graph 402 represents the negative signal. In this state, a common voltage 403 of the positive signal rises, and a common voltage 404 of the negative signal falls down. Therefore, the common voltage 403 and the common voltage 404 are diverged from each other.

In a clock waveform generated from a difference between the positive signal and the negative signal in the above-described state, a large amplitude indicated by an arrow 405 and a small amplitude indicated by an arrow 406 occur. The clock waveform generated from the positive signal and the negative signal in the state of FIG. 3A is as indicated by a graph 407 in FIG. 4A. In the graph 407, a time 408 and a time 409 do not match each other, and the duty ratio is out of balance. In this state, the CML buffer 10 is incapable of generating an appropriate clock.

Thus, the control circuit 109 changes the amplitudes of the positive signal and the negative signal so that the common voltage of the positive signal and the common voltage of the negative signal match each other. In this case, the control circuit 109 controls the resistance value of the variable resistor 103 and the bias voltage of the transistor 105 by the above-described control so that the amplitude of the positive signal indicated by the graph 401 of FIG. 3A is extended to a direction indicted by an arrow P. The control circuit 109 also controls the resistance value of the variable resistor 104 and the bias voltage of the transistor 106 by the above-described control so that the amplitude of the positive signal indicated by the graph 402 of FIG. 3A is contracted to a direction indicated by an arrow Q. With this, the amplitude of the positive signal is extended in the P direction to be increased, thereby causing the common voltage to fall down. The amplitude of the negative signal is contracted in the Q direction to be decreased, thereby causing the common voltage to rise. As a result, the positive signal has a waveform as indicated by a graph 410 of FIG. 3B, and the negative signal has a waveform as indicted by a graph 420 of FIG. 3B. The positive signal and the negative signal each have a common voltage 430, and therefore the common voltages of the positive signal and the negative signal match each other.

The amplitude of the clock waveform generated from the difference between the positive signal and the negative signal in the above-described state is indicated by an arrow 431 and an arrow 432. The clock waveform generated from the positive signal and the negative signal in the state of FIG. 3B is as indicated by a graph 440 of FIG. 4B. In the graph 440, a time 441 and a time 442 match each other, and the duty ratio is 50:50. In this case, the CML buffer 10 is capable of generating an appropriate clock.

Referring back to FIG. 2, description continues. The constant current source 31 is connected to the drain terminal of the transistor 32. The constant current source 31 lets a predetermined current flow therethrough.

The transistor 32 is a MOS transistor. The source terminal of the transistor 32 is connected to the ground. Here, while the transistor 32 is connected to the ground in the present embodiment, this is not meant to be restrictive, and the transistor 32 may be connected to a negative power source voltage. The constant current source 31 and the transistor 32 form a bias circuit. A bias voltage (Vbias) with a predetermined value is applied to the gate terminals of the transistors 32 and 37.

The transistors 33 and 34 are MOS transistors. The gate terminal of the transistor 33 is connected between the variable resistor 104 and the transistor 102. That is, a drain terminal voltage of the transistor 102 is applied to the gate terminal of the transistor 33.

The resistor 35 is disposed between the drain terminal of the transistor 33 and the power supply voltage.

The gate terminal of the transistor 34 is connected between the variable resistor 103 and the transistor 101. That is, a drain terminal voltage of the transistor 101 is applied to the gate terminal of the transistor 34.

The resistor 36 is disposed between the drain terminal of the transistor 34 and the power supply voltage.

The transistor 37 is a MOS transistor. The transistor 37 is cascode-connected to the transistors 33 and 34. Specifically, the source terminals of the transistors 33 and 34 are commonly connected to the drain terminal of the transistor 37. Furthermore, the source terminal of the transistor 37 is connected to the ground. Here, while the transistor 37 is connected to the ground in the present embodiment, this is not meant to be restrictive, and the transistor 37 may be connected to a negative power supply voltage. A bias voltage with a predetermined value is applied to the gate terminal of the transistor 37. The transistor 37 is a bias transistor for the transistors 33 and 34. That is, the transistor 37 is a tail transistor which extracts a predetermined current from the transistors 33 and 34.

The transistor 37 extracts the predetermined current from the transistors 33 and 34. When the positive input signal is at a high level "H" and the negative input signal is at a low level "L", the transistor 33 is in an ON state. Therefore, the predetermined current flows from the power supply voltage Vdd via the resistor 35, the transistor 33, and then the transistor 37 to the ground. On the contrary, since the transistor 34 is in an OFF state, a current does not flow.

When the circuit is in the above-described state, it is assumed that the positive input signal falls down to a low level and the negative input signal rises to a high level. Then, the route of the current flowing from the power supply voltage Vdd is switched, causing the current to flow on a transistor 34 side.

Here, in the CML buffer 10b, the amplitudes of the positive signal and the negative signal are independently changed. Therefore, the amplitudes of the positive signal and the negative signal outputted from the CML buffer 10b are imbalanced, as depicted in FIG. 3B. However, at the next stage of the CML buffer 10b, the resistors 35 and 36 are identical, and the bias voltages for the positive signal and the negative signal are equal to each other. Therefore, the output amplitude of the positive signal outputted from an output terminal 301 and the output amplitude of the negative signal outputted from an output terminal 302 match each other. Therefore, the clock generated from the positive signal outputted from the output terminal 301 and the negative signal outputted from the output terminal 302 is stable.

Furthermore, the CML buffers 10d and 10e of FIG. 1 are described. Variability of process in a chip at the time of manufacturing is considered as being fixed. Therefore, the differential amount in common voltage occurring due to passages through the CML buffers 100 at the predetermined number of stages in FIG. 1 is considered as being the same.

Thus, as depicted in FIG. 1, measurement of the common voltage by the ADC 120 and the control circuit 109 and calculation of the resistance value and the bias voltage using the measurement result are sufficiently performed only by the CML buffer 10b. The CML buffers 10d and 10e perform control by using the resistance value and the bias voltage calculated by the CML buffer 10b.

That is, the CML buffers 10d and 10e have the transistors 101 and 102, the variable resistors 103 and 104, the transistor 105 and 106, and the DACs 110 and 111 in FIG. 2. The CML buffers 100d and 100e in FIG. 1 correspond to the transistors 101 and 102, the variable resistors 103 and 104, and the transistors 105 and 106.

The variable resistors 103 and 104 in the CML buffers 10d and 10e receive control of setting the resistance values from the control circuit 109 of the CML buffer 10b.

The DACs 110 and 111 in the CML buffers 10d and 10e receive from the control circuit 109 of the CML buffer 10b an input of a bias voltage to be applied. Then, the DACs 110 and 111 in the CML buffers 10d and 10e apply the received bias voltage to the gate terminals of the transistors 105 and 106, respectively.

With this, the difference in common voltage is adjusted as occasion arises by the CML buffers 10b, 10d, and 10e having the common voltage control function and disposed so as to be uniformly spaced apart from each other, and an appropriate clock at a duty ratio of 50:50 is transmitted.

Here, an allowable value of the difference in common voltage, in other words, an allowable value of the duty ratio in the generated clock, depends on a transmission rate. Thus, when an ADC and a DAC are used to control the common voltage, accuracy is preferably set in accordance with the allowable value of the common voltage. Also, adjusting accuracy in accordance with the allowable value of the common voltage applies to the case where a method without using an ADC or a DAC is used as a method of controlling the common voltage.

Furthermore, while three CML buffers performing common voltage control are depicted in FIG. 1, this is merely an example, and it is preferable to determine a CML buffer(s) performing common voltage control depending on the number of stages and the use state of the CML buffer(s).

For example, when the difference in common voltage occurring every passage through one CML buffer is large, the space between which CML buffers performing common voltage control are disposed is preferably short. Also, when the allowable difference in common voltage is large, adjustment may not be performed until a difference in common voltage within the allowable range occurs. With this, the space between which CML buffers performing common voltage control are disposed is increased.

Figure 5:
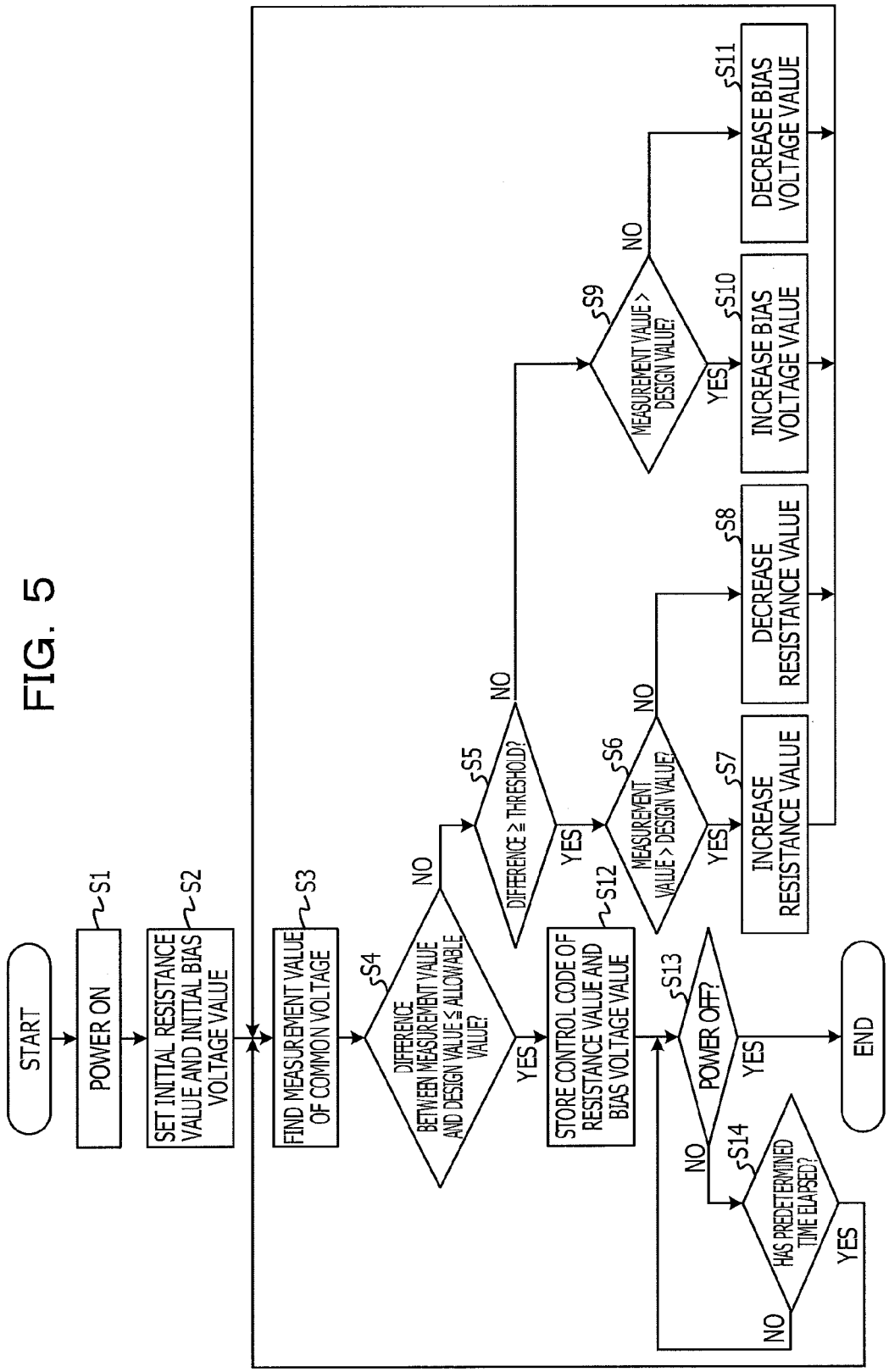
FIG. 5 is a flowchart of common voltage control in the clock transmission circuit according to the first embodiment.

Next, common voltage control in the clock transmission circuit 1 according to the present embodiment is described with reference to FIG. 5. FIG. 5 is a flowchart of common voltage control in the clock transmission circuit according to the first embodiment.

The information processing apparatus having the clock transmission circuit 1 is powered ON (step S1).

The control circuit 109 sets an initial resistance value to the variable resistor 104. The control circuit 109 also transmits an initial value of the bias voltage to the DAC 111. The DAC 111 receives the initial value of the bias voltage, and applies a bias voltage with the initial value to the gate terminal of the transistor 106 (step S2).

The ADC 107 measures a voltage of a current flowing from the power supply voltage via the variable resistor 104. The ADC 107 then transmits the voltage measurement result to the control circuit 109. The control circuit 109 finds a measurement value of the common voltage of the positive signal based on the voltage measurement result received from the ADC 107 (step S3).

Next, the control circuit 109 finds a difference between the measurement value and the design value of the common voltage, and determines whether the found difference is equal to or smaller than an allowable value (step S4).

When the difference is larger than the allowable value (negative at step S4), the control circuit 109 determines whether the found difference is equal to or larger than a threshold (step S5).

When the found difference is equal to or larger than the threshold (positive at step S5), the control circuit 109 determines whether the measurement value is larger than the design value (step S6). When the measurement value is larger than the design value (positive at step S6), the control circuit 109 increases the resistance value of the variable resistor 104 by one step (step S7), and then returns to step S3.

By contrast, when the measurement value is smaller than the design value (negative at step S6), the control circuit 109 decreases the resistance value of the variable resistor 104 by one step (step S8), and then returns to step S3.

On the other hand, when the found difference is smaller than the threshold (negative at step S5), the control circuit 109 determines whether the measurement value is larger than the design value (step S9). When the measurement value is larger than the design value (positive at step S9), the control circuit 109 outputs to the DAC 111 a bias voltage obtained by increasing the voltage value by one step. The DAC 111 increases the voltage value of the bias voltage to be applied to the gate terminal of the transistor 106 by one step (step S10), and then returns to step S3.

By contrast, when the measurement value is smaller than the design value (negative at step S9), the control circuit 109 outputs to the DAC 111 a bias voltage obtained by decreasing the voltage value by one step. The DAC 111 decreases the voltage value of the bias voltage to be applied to the gate terminal of the transistor 106 by one step (step S11), and then returns to step S3.

On the other hand, when the difference between the measurement value and the design value is equal to or smaller than the allowable value (positive at step S4), the control circuit 109 stores control code of the resistance value and the bias voltage value at that moment (step S12).

The control circuit 109 then determines whether the information processing apparatus has been powered OFF (step S13). If the information processing apparatus has not been powered OFF (negative at step S13), the control circuit 109 determines whether a predetermined time has elapsed while controlling the common voltage with the stored control code (step S14). If the predetermined time has not elapsed (negative at step S14), the control circuit 109 returns to step S13.

By contrast, if the predetermined time has elapsed (positive at step S14), the control circuit 109 returns to step S3.

On the other hand, if the information processing apparatus has been powered OFF (positive at step S13), the control circuit 109 ends common voltage control.

Here, in the flow of FIG. 5, the control circuit 109 performs common voltage control every time the predetermined time elapses, in consideration of the occurrence of a change in a shift amount of the common voltage occurring due to fluctuations in temperature or voltage. However, if a change in the shift amount of the common voltage does not occur, after adjusting the common voltage once, the control circuit 109 may perform control by using the determined resistance value and bias voltage value.

Figure 6:
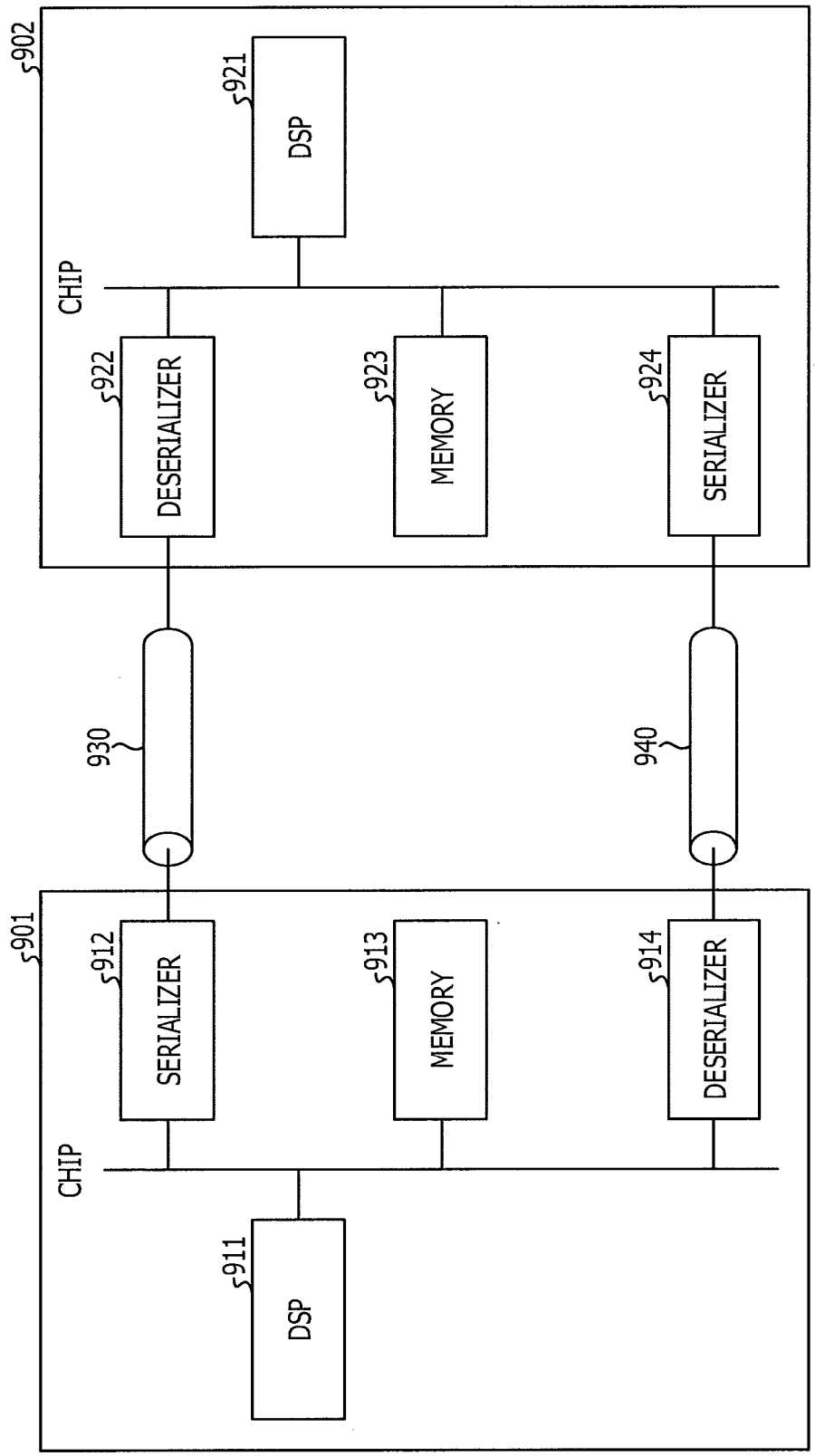
FIG. 6 is a diagram depicting an example of an information processing apparatus having the clock transmission circuit according to the first embodiment.

FIG. 6 is a diagram depicting an example of the information processing apparatus having the clock transmission circuit according to the first embodiment. The information processing apparatus has chips 901 and 902.

The chip 901 has a digital signal processor (DSP) 911, a serializer 912, a memory 913, and a deserializer 914. The DSP 911, the serializer 912, the memory 913, and the deserializer 914 are connected to one another via a bus.

The chip 902 has a DSP 921, a deserializer 922, a memory 923, and a serializer 924. The DSP 921, the deserializer 922, the memory 923, and the serializer 924 are connected to one another via a bus.

The serializer 912 and the deserializer 922 are connected via a signal transmission circuit 930. The serializer 924 and the deserializer 914 are connected via a signal transmission circuit 940.

The clock transmission circuit 1 is disposed in each of the signal transmission circuits 930 and 940. The serializer 912 transmits a clock to the deserializer 922 by using the clock transmission circuit 1 in the signal transmission circuit 930. The serializer 924 transmits a clock to the deserializer 914 by using the clock transmission circuit 1 in the signal transmission circuit 940.

The units in the chips 901 and 902 each operate by using the received clock, thereby mutually synchronizing with each other.

As described above, the clock transmission circuit and the information processing apparatus according to the present embodiment make an adjustment so that the common voltages of the positive signal and the negative signal of one of the differential signals are approximate to each other. With this, the amplitude of the clock generated from the positive signal and the negative signal becomes fixed, and a stable clock is generated. According to the clock transmission circuit of the present embodiment, a voltage measurement circuit such as the ADCs 107 and 108, a bias control circuit such as the DACs 110 and 111, and a common voltage control circuit such as the control circuit 109 are added to adjust the common voltage. That is, the clock transmission circuit according to the present embodiment adjusts the common voltage without disposing a capacitive cell. The size including the voltage measurement circuit and the common voltage control circuit is smaller than the size of a capacitive cell. Therefore, in the clock transmission circuit according to the present embodiment, the mounting area is decreased compared with the case where a capacitive cell is disposed.

Furthermore, since a capacitive cell is not disposed, a band from DC to a maximum operation clock frequency is supported, thereby widening the band for clock transmission.

Still further, since a capacitive cell is not disposed, a cell for noise reduction is allowed to be disposed, thereby reducing an influence of noise and ensuring a stable operation.

While the control circuit 109 performs digital processing to calculate a resistance value and a bias voltage value in the above description, the control circuit 109 may be configured as an analog circuit.

Still further, while the control circuit 109 performs control by comparing the measurement value and the set value of the common voltage, this is not meant to be restrictive. For example, the common voltage of a positive signal and the common voltage of a negative signal may be compared with each other and may be controlled so as to become approximate to each other.

Second Embodiment

Figure 7:
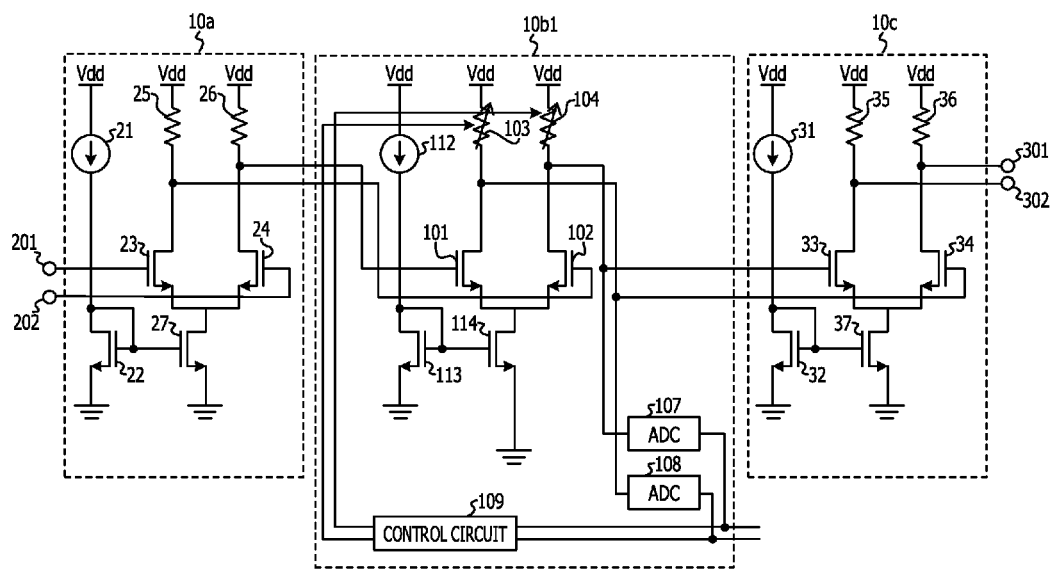
FIG. 7 is a circuit diagram depicting details of a clock transmission circuit according to a second embodiment.

FIG. 7 is a circuit diagram depicting details of a clock transmission circuit according to a second embodiment. A CML buffer 10b1 according to the present embodiment is different from that of the first embodiment in that the common voltage is controlled only by changing the resistance. CML buffers without the common voltage control function at the stages preceding and subsequent to the CML buffer 10b1 are identical to those of the first embodiment, and therefore are not described herein. Also in the CML buffer 10b1, each unit performing the same operation as that of the first embodiment is not described herein.

The CML buffer 10b1 according to the present embodiment has the transistors 101 and 102, the variable resistors 103 and 104, the ADCs 107 and 108, the control circuit 109, a constant current source 112, a transistor 113, and a transistor 114.

The constant current source 112 is connected to the drain terminal of the transistor 113. The constant current source 112 lets a predetermined current flow therethrough.

The transistor 113 is a MOS transistor. The source terminal of the transistor 113 is connected to the ground. Here, while the transistor 113 is connected to the ground in the present embodiment, this is not meant to be restrictive, and the transistor 113 may be connected to a negative power supply voltage. The constant current source 112 and the transistor 113 form a bias circuit. A bias voltage with a predetermined value is applied to the gate terminals of the transistors 113 and 114.

The variable resistor 103 is disposed between the drain terminal of the transistor 101 and the power supply voltage, and the variable resistor 104 is disposed between the drain terminal of the transistor 102 and the power supply voltage.

The transistor 114 is a MOS transistor. The transistor 114 is cascode-connected to the transistors 101 and 102. Specifically, the source terminals of the transistors 101 and 102 are commonly connected to the drain terminal of the transistor 114. Furthermore, the source terminal of the transistor 114 is connected to the ground. Here, while the transistor 114 is connected to the ground in the present embodiment, this is not meant to be restrictive, and the transistor 114 may be connected to a negative power supply voltage. A bias voltage with a predetermined value is applied to the gate terminal of the transistor 114. The transistor 114 is a bias transistor for the transistors 101 and 102.

The control circuit 109 receives inputs of the voltage measurement value of the positive signal and the voltage measurement value of the negative signal from the ADCs 107 and 108. From the received voltage measurement values, the control circuit 109 finds a common voltage measurement value of the positive signal and a common voltage measurement value of the negative signal. While positive signal control by the control circuit 109 is described below, the same applies to negative signal control.

The control circuit 109 finds a difference between the found measurement value of the positive signal and the design value. Then, when the difference exceeds an allowable value, the control circuit 109 finds which of the measurement value and the design value is larger.

When the measurement value is larger than the design value, the control circuit 109 increases the resistance value of the variable resistor 103 by one step. By contrast, when the measurement value is smaller than the design value, the control circuit 109 decreases the resistance value of the variable resistor 104 by one step.

The control circuit 109 repeats the above-described one-step control at a plurality of steps until the difference falls within the allowable value.

As described above, the CML buffer 10b1 according to the present embodiment performs common voltage control by changing the resistance value, thereby making the common voltage of the positive signal and the common voltage of the negative signal approximate to each other. With this, the clock generated by using the positive signal and the negative signal is stable with less imbalance of the duty ratio.

In the clock transmission circuit according to the present embodiment, a capacitive cell is not used. Therefore, the mounting area is made small in the clock transmission circuit according to the present embodiment.

Third Embodiment

Figure 8:
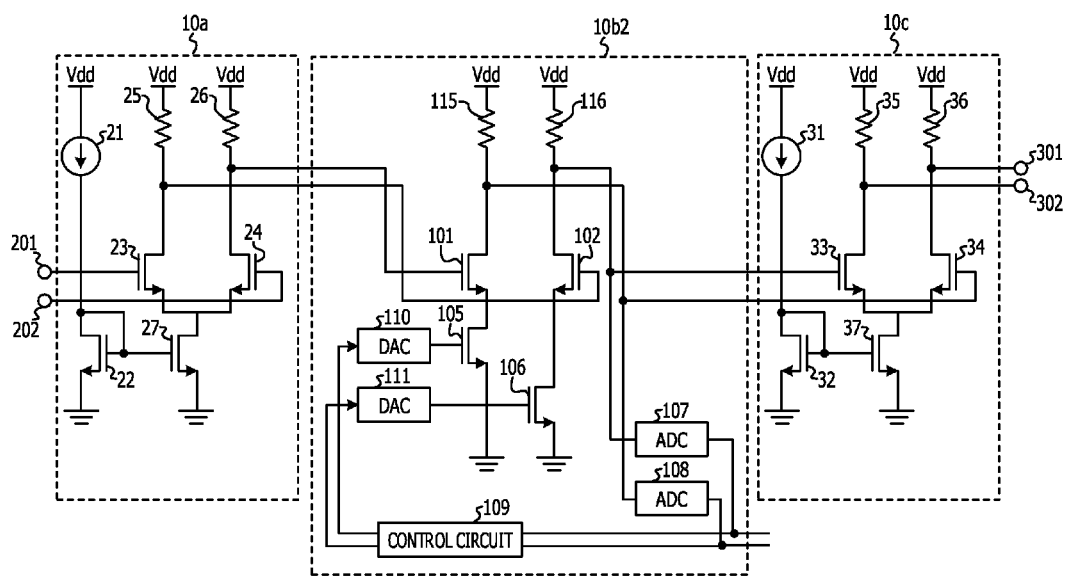
FIG. 8 is a circuit diagram depicting details of a clock transmission circuit according to a third embodiment.

FIG. 8 is a circuit diagram depicting details of a clock transmission circuit according to a third embodiment. A CML buffer 10b2 according to the present embodiment is different from that of the first embodiment in that the common voltage is controlled only by changing the bias voltage. CML buffers without the common voltage control function at the stages preceding and subsequent to the CML buffer 10b2 are identical to those of the first embodiment, and therefore are not described herein. Also in the CML buffer 10b2, each unit performing the same operation as that of the first embodiment is not described herein.

The CML buffer 10b2 according to the present embodiment has the transistors 101 and 102, resistors 115 and 116, the ADCs 107 and 108, the control circuit 109, the DACs 110 and 111, and the transistors 105 and 106.

The resistor 115 is disposed between the drain terminal of the transistor 101 and the power supply voltage, and the resistor 116 is disposed between the drain terminal of the transistor 102 and the power supply voltage. The resistant values of the resistors 115 and 116 are fixed.

The transistor 105 is cascode-connected to the transistor 101. Specifically, the source terminal of the transistor 101 is connected to the drain terminal of the transistor 105. The source terminal of the transistor 105 is connected to the ground. Furthermore, the gate terminal of the transistor 105 is connected to the DAC 110.

The gate terminal of the transistor 105 is connected to the DAC 110. The transistor 105 receives application of a bias voltage from the DAC 110.

The transistor 106 is cascode-connected to the transistor 102. Specifically, the source terminal of the transistor 102 is connected to the drain terminal of the transistor 106. The source terminal of the transistor 106 is connected to the ground.

The gate terminal of the transistor 106 is connected to the DAC 111. The transistor 106 receives application of a bias voltage from the DAC 111.

The control circuit 109 receives inputs of the voltage measurement value of the positive signal and the voltage measurement value of the negative signal from the ADCs 107 and 108. From the received voltage measurement values, the control circuit 109 finds a common voltage measurement value of the positive signal and a common voltage measurement value of the negative signal. While positive signal control by the control circuit 109 is described below, the same applies to negative signal control.

The control circuit 109 finds a difference between the found measurement value of the positive signal and the design value. Then, when the difference exceeds an allowable value, the control circuit 109 finds which of the measurement value and the design value is larger.

When the measurement value is larger than the design value, the control circuit 109 outputs to the DAC 110 a bias voltage obtained by increasing the voltage value by one step. By contrast, when the measurement value is smaller than the design value, the control circuit 109 outputs to the DAC 111 a bias voltage obtained by decreasing the voltage value by one step.

The control circuit 109 repeats the above-described one-step control at a plurality of steps until the difference falls within the allowable value.

As described above, the CML buffer 10b2 according to the present embodiment performs common voltage control by changing the bias voltage value, thereby making the common voltage of the positive signal and the common voltage of the negative signal approximate to each other. With this, the clock generated by using the positive signal and the negative signal is stable with less imbalance of the duty ratio.

In the clock transmission circuit according to the present embodiment, a capacitive cell is not used. Therefore, the mounting area is made small in the clock transmission circuit according to the present embodiment.

Here, as described in the first embodiment, the resistance value is significantly changeable, and the bias voltage is changeable within a limited range. Thus, when the common voltage is adjusted with the resistance value as in the second embodiment, the space between which CML buffers having the common voltage control function among the CML buffers disposed in a multistage manner are disposed may be lengthened. By contrast, when the common voltage is adjusted with the bias voltage value as in the third embodiment, the space between which CML buffers having the common voltage control function among the CML buffers disposed in a multistage manner are disposed is shortened.

Fourth Embodiment

Figure 9:
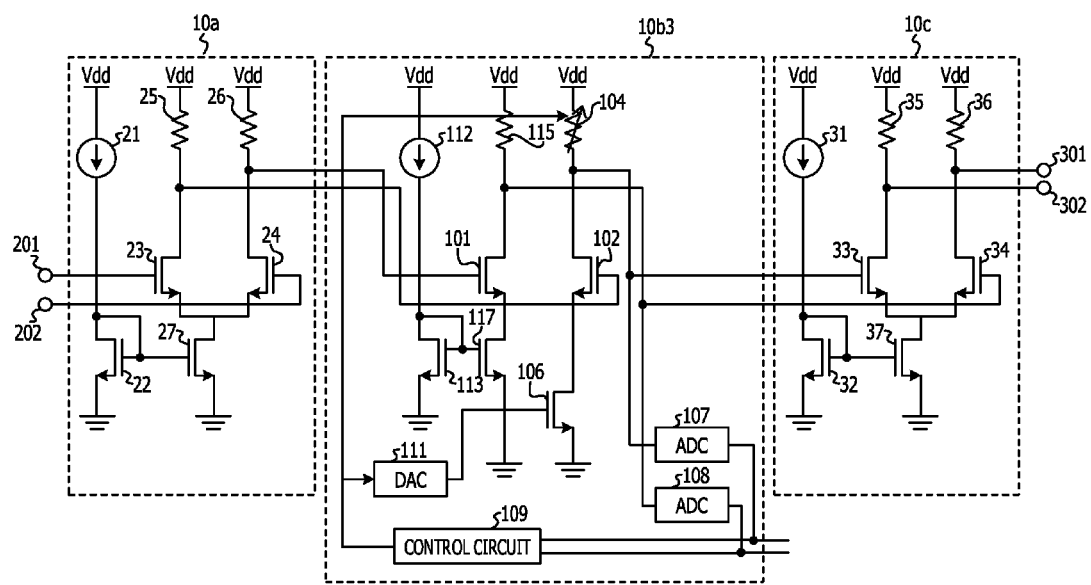
FIG. 9 is a circuit diagram depicting details of a clock transmission circuit according to a fourth embodiment.

FIG. 9 is a circuit diagram depicting details of a clock transmission circuit according to a fourth embodiment. A CML buffer 10b3 according to the present embodiment is different from that of the first embodiment in that the common voltage is controlled only by changing the bias voltage and the resistance for one in the input differential pair. CML buffers without the common voltage control function at the stages preceding and subsequent to the CML buffer 10b3 are identical to those of the first embodiment, and therefore are not described herein. Also in the CML buffer 10b3, each unit performing the same operation as that of the first embodiment is not described herein. In the following description, the case of adjusting the common voltage of the negative signal is described.

The CML buffer 10b3 according to the present embodiment has the transistors 101 and 102, the resistor 115, the variable resistor 104, the ADCs 107 and 108, the control circuit 109, the DAC 111, the transistor 106, the constant current source 112, the transistor 113, and a transistor 117.

The resistor 115 is a resistor with a fixed resistance value. The resistor 115 is disposed between the drain terminal of the transistor 101 and the power supply voltage.

The variable resistor 104 is a variable resistor with a variable resistance value. The variable resistor 104 is disposed between the drain terminal of the transistor 102 and the power supply voltage.

The constant current source 112 is connected to the drain terminal of the transistor 113. The constant current source 112 lets a predetermined current flow therethrough.

The source terminal of the transistor 113 is connected to the ground. The constant current source 112 and the transistor 113 form a bias circuit. A bias voltage with a predetermined value is applied to the gate terminals of the transistor 113 and the transistor 117.

The transistor 106 is cascode-connected to the transistor 102. Specifically, the source terminal of the transistor 102 is connected to the drain terminal of the transistor 106. The source terminal of the transistor 106 is connected to the ground. The transistor 106 receives application of a bias voltage from the DAC 111.

The control circuit 109 receives inputs of the voltage measurement value of the positive signal and the voltage measurement value of the negative signal from the ADCs 107 and 108. From the received voltage measurement values, the control circuit 109 finds a common voltage measurement value of the positive signal and a common voltage measurement value of the negative signal.

The control circuit 109 finds a difference between the found common voltage measurement value of the positive signal and the found common voltage measurement value of the negative signal. Next, the control circuit 109 determines whether the found difference exceeds an allowable value. When the difference exceeds the allowable value, the control circuit 109 determines whether the difference is equal to or larger than a threshold.

When the difference is equal to or larger than the threshold, the control circuit 109 decreases the resistance value of the variable resistor 104 by one step. By contrast, when the difference is smaller than the threshold, the control circuit 109 outputs to the DAC 111 a bias voltage obtained by decreasing the voltage value by one step.

The control circuit 109 repeats the above-described one-step control at a plurality of steps until the difference falls within the allowable value.

Here, while the common voltage of the negative signal is adjusted to make the common voltage of the positive signal and the common voltage of the negative signal approximate to each other in the present embodiment, the above-described control may also apply when the common voltage of the positive signal is adjusted.

As described above, the CML buffer 10b3 according to the present embodiment performs common voltage control by changing the bias voltage value and the resistance value for one in the input differential pair, thereby making the common voltage of the positive signal and the common voltage of the negative signal approximate to each other. With this, the clock generated by using the positive signal and the negative signal is stable with less imbalance of the duty ratio.

In the clock transmission circuit according to the present embodiment, a capacitive cell is not used. Therefore, the mounting area is made small in the clock transmission circuit according to the present embodiment.

Fifth Embodiment

Figure 10:
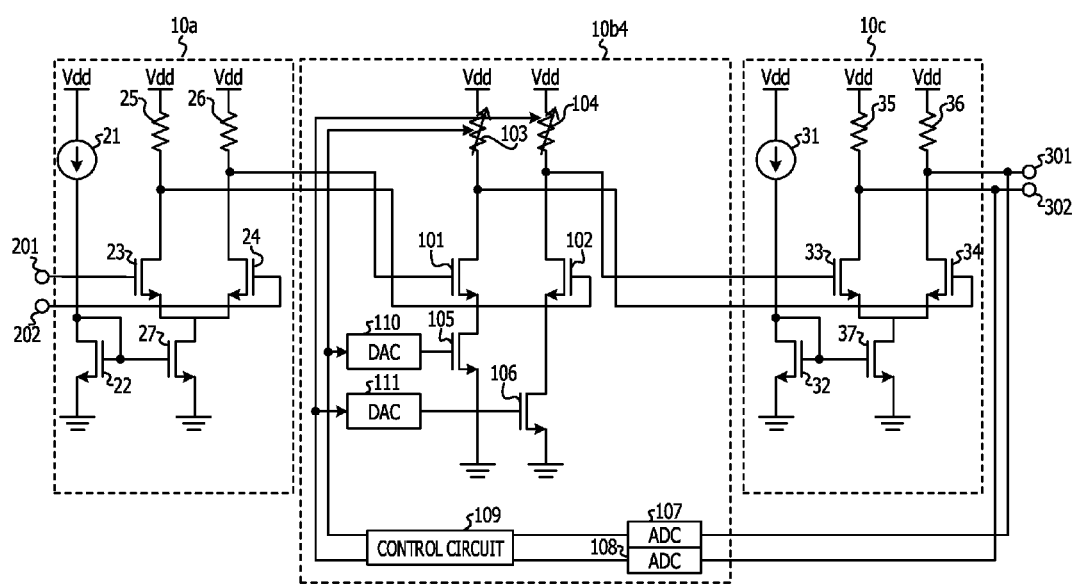
FIG. 10 is a circuit diagram depicting details of a clock transmission circuit according to a fifth embodiment.

FIG. 10 is a circuit diagram depicting details of a clock transmission circuit according to a fifth embodiment. A CML buffer 10b4 according to the present embodiment is different from that of the first embodiment in that the common voltage is measured by using the voltage of the output signal from the CML buffer at the next stage (the immediately subsequent stage). CML buffers without the common voltage control function at the stages preceding and subsequent to the CML buffer 10b4 are identical to those of the first embodiment, and therefore are not described herein.

The ADC 107 measures a voltage of the positive signal supplied from the power supply voltage via the resistor 36 to the output terminal 301. The ADC 107 outputs the measurement result to the control circuit 109.

Here, the resistor 35, the transistor 33, and the transistor 37 correspond to an example of a "third amplifying unit". The positive signal supplied from the power supply voltage via the resistor 36 to the output terminal 301 corresponds to an example of a "third output signal".

The ADC 108 measures a voltage of the negative signal supplied from the power supply voltage via the resistor 35 to the output terminal 302. The ADC 108 then outputs the measurement result to the control circuit 109.

Here, the resistor 36, the transistor 34, and the transistor 37 correspond to an example of a "fourth amplifying unit". The positive signal supplied from the power supply voltage via the resistor 35 to the output terminal 302 corresponds to an example of a "fourth output signal".

From the voltage values of the output signals from the CML buffer at the next stage inputted from the ADCs 107 and 108, the control circuit 109 finds a common voltage of the positive signal and a common voltage of the negative signal. Then, by using the found common voltages, the control circuit 109 performs control in a manner similar to that of the first embodiment.

As described above, by using the outputs from the CML buffer at the next stage, the CML buffer 10b4 according to the present embodiment performs common voltage control, thereby making the common voltage of the positive signal and the common voltage of the negative signal approximate to each other. In the CML buffer at the next stage, the amplitude of the positive signal and the amplitude of the negative signal match each other. Therefore, the common voltage is measured more accurately by using the signal outputted from the CML buffer at the next stage than by using the output from the CML buffer 10b4. Therefore, the clock transmission circuit according to the present embodiment performs common voltage adjustment more accurately than the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic component comprising:
   a first amplifier that amplifies one signal of differential signals and includes a first transistor, a first tail transistor that extracts a predetermined current from the first transistor and a first variable resistor that controls drain voltage of the first transistor;
   a second amplifier that amplifies another signal of the differential signals and includes a second transistor, a second tail transistor that extracts a predetermined current from the second transistor and a second variable resistor that controls drain voltage of the second transistor;
   a first sensor that measures voltages of a first output signal outputted from the first amplifier;
   a second sensor that measures voltages of a second output signal outputted from the second amplifier; and
   a control circuit that controls, based on the voltages measured by the first and second sensors, resistance value of the first variable resistor and a bias voltage of the first tail transistor, or
   a resistance value of the second variable resistor and a bias voltage of the second tail transistor,
   in order to adjust the amplitudes of the first output signal and the second output signal to make common voltage of the first output signal and a common voltage of the second output signal approximate to each other.

2. The electronic component according to claim 1, wherein the control circuit controls either one or both of a current and a voltage of the second amplifier in addition to either one or both of a current and a voltage of the first amplifier so as to make a common voltage of the first output signal and a common voltage of the second output signal approximate to each other.

3. The electronic component according to claim 2, wherein the control circuit
   increases the resistance value of the first variable resistor when decreasing the common voltage of the first output signal, and
   decreases the resistance value of the first variable resistor when increasing the common voltage of the first output signal.

4. The electronic component according to claim 1, wherein the first tail transistor cascade-connected to the first transistor;
   the second tail transistor cascade-connected to the second transistor,
   wherein the control circuit
   adjusts the current flowing through the first transistor by changing a bias voltage of the first tail transistor, and
   adjusts the current flowing through the second transistor by changing a bias voltage of the second tail transistor.

5. The electronic component according to claim 4, wherein the control circuit
   increases the bias voltage of the first transistor when decreasing the common voltage of the first output signal, and
   decreases the bias voltage of the first transistor when increasing the common voltage of the first output signal, and
   the control circuit
   increases the bias voltage of the second transistor when decreasing the common voltage of the second output signal, and
   decreases the bias voltage of the second transistor when increasing the common voltage of the second output signal.

6. The electronic component according to claim 2, further comprising:
   a third amplifier that amplifies the first output signal; and
   a fourth amplifier that amplifies the second output signal, wherein
   the sensor measures common voltages of a third output signal outputted from the third amplifier and a fourth output signal outputted from the fourth amplifier as the common voltages of the first output signal and the second output signal.

7. An electronic component control method comprising:
   measuring voltages of a first output signal outputted from a first amplifier configured to amplify one of differential signals, the first amplifier including a first transistor, a first tail transistor that extracts a predetermined current from the first transistor and a first variable resistor that controls drain voltage of the first transistor;
   measuring voltages of a second output signal outputted from a second amplifier configured to amplify another one of the differential signals, the second amplifier including a second transistor, a second tail transistor that extracts a predetermined current from the second transistor and a second variable transistor resistor that controls drain voltage of the second transistor; and
   based on the measured voltages, controlling either one or both of a resistance value of the first variable resistor and a bias voltage of the first tail transistor and a resistance value of the second variable resistor and a bias voltage of the second tail transistor, so that a common voltage of the first output signal and a common voltage of the second output signal are approximate to each other.

8. The electronic component according to claim 1, wherein the electronic component is a current mode logic (CML) buffer that operates as a clock transmission circuit.

9. The electronic component control method according to claim 7, wherein the first amplifier and the second amplifier are included in a current mode logic (CML) buffer that operates as a clock transmission circuit.

* * * * *